United States Patent
Cai et al.

(10) Patent No.: US 9,454,428 B2
(45) Date of Patent: Sep. 27, 2016

(54) ERROR CORRECTION METHOD AND MODULE FOR NON-VOLATILE MEMORY

(71) Applicant: Agency for Science, Technology and Research, Singapore (SG)

(72) Inventors: Kui Cai, Singapore (SG); Zhiliang Qin, Singapore (SG); Xueqiang Wang, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 132 days.

(21) Appl. No.: 14/554,577

(22) Filed: Nov. 26, 2014

(65) Prior Publication Data

US 2015/0149873 A1   May 28, 2015

(30) Foreign Application Priority Data

Nov. 26, 2013   (SG) .................... 201308752

(51) Int. Cl.
| | | |
|---|---|---|
| *H03M 13/00* | (2006.01) | |
| *G06F 11/10* | (2006.01) | |
| *H03M 13/45* | (2006.01) | |
| *G11C 11/16* | (2006.01) | |
| *H03M 13/15* | (2006.01) | |

(52) U.S. Cl.
CPC .......... *G06F 11/1012* (2013.01); *G11C 11/161* (2013.01); *H03M 13/152* (2013.01); *H03M 13/451* (2013.01); *H03M 13/458* (2013.01)

(58) Field of Classification Search
CPC ............ H03M 13/458; G06F 11/1012; G11C 11/161
See application file for complete search history.

(56) References Cited

U.S. PATENT DOCUMENTS

| 5,602,858 | A | * | 2/1997 | Kitaori | G11B 20/10009 360/65 |
|---|---|---|---|---|---|
| 6,161,209 | A | * | 12/2000 | Moher | H03M 13/6306 375/262 |
| 6,581,179 | B1 | * | 6/2003 | Hassan | H04B 7/2643 714/776 |
| 6,847,760 | B2 | * | 1/2005 | Argon | G02B 6/4202 385/24 |
| 7,260,762 | B2 | * | 8/2007 | Desai | H03M 13/2963 714/755 |
| 7,310,767 | B2 | * | 12/2007 | Desai | H03M 13/3784 714/780 |
| 7,835,245 | B2 | * | 11/2010 | Shimizu | G11B 20/10009 360/31 |
| 8,108,759 | B2 | * | 1/2012 | Moon | H03M 13/15 714/781 |
| 8,176,400 | B2 | * | 5/2012 | Tan | H04L 1/0045 714/767 |
| 8,661,324 | B2 | * | 2/2014 | Yang | H03M 13/1102 714/758 |

* cited by examiner

*Primary Examiner* — Esaw Abraham
(74) *Attorney, Agent, or Firm* — K. David Crockett, Esq.; Niky Economy Syrengelas, Esq.; Crockett & Crockett, PC

(57) ABSTRACT

There is provided an error correction method for a non-volatile memory. The method includes receiving a codeword read from the non-volatile memory, computing a reliability information for each bit of the codeword received, and performing a reduced-complexity soft-decision decoding (SDD) technique to decode the received codeword. In particular, the SDD technique includes forming a set of test patterns based on the reliability data, and determining whether to perform a HDD of a test pattern in the set of test patterns based on a distance between the test pattern and a candidate pattern. There is also provided an error correction module for a non-volatile memory and a memory system incorporating the error correction module.

20 Claims, 6 Drawing Sheets

ERROR CORRECTION METHOD AND MODULE FOR NON-VOLATILE MEMORY

CROSS-REFERENCE TO RELATED APPLICATION

This application claims the benefit of priority of Singapore Patent Application No. 201308752-3, filed Nov. 26, 2013, the contents of which are incorporated herein by reference for all purposes.

TECHNICAL FIELD

The present invention generally relates to an error correction method and module for a non-volatile memory. The present invention also relates to a memory system incorporating the error correction module.

BACKGROUND

Among various solid-state non-volatile memories (NVM) technologies which have been developed rapidly in recent years, high-density and high-speed NVM are especially expected for different applications, such as in modern computing systems and data centers, portable devices, and various consumer electronics. For example, Dynamic Random Access Memory (DRAM) has been used as the main memory in computer systems for decades due to its high density, high speed, and low cost. However, as DRAM is volatile, the stored data cannot be sustained when the power is switched off. Furthermore, there is a continuous demand for the capacity of the main memory, while DRAM faces significant challenges beyond the 20 nm technology node due to various limitations associated with device leakages and retention time. Therefore, intensive research has been carried out to investigate alternative memory technologies to replace DRAM. For example, Spin-Torque Transfer magnetic random access memory (STT-MRAM) has emerged as a promising NVM technology, featuring compelling advantages in scalability, speed, endurance, and power consumption. It has been considered as a competing technology to replace DRAM at the main memory level since it enables non-volatile data retention as well as a significant reduction of power consumption.

However, in STT-MRAM for example, the reliability of data is seriously affected by various factors, such as the variation of the magnetic tunneling junction (MTJ) resistances due to the process-induced statistical parametric variations, the write errors due to switching current threshold distributions of the MTJ and the insufficient write current caused by variations of the nMOS transistor, as well as the read errors due to the read disturbance and memory sensing inaccuracy. Currently, in the example of STT-MRAM, considerable efforts have been made on device design, material improvement, and wafer processing. However, very little work has been done from a coding and signal processing perspective to correct the cell errors of STT-MRAM. Furthermore, for STT-MRAM to be used as the DRAM replacement in the main memory, the error correction coding needs to meet up to both the requirements of high-speed and high-density. These two requirements in general contradict or oppose each other during the code design. The state of the art error correction codes (ECCs) used for NVM, such as STT-MRAM, is the simple Hamming codes or BCH codes. Although the Hamming codes and BCH codes have fast encoder and decoder, it may not be sufficient to satisfy the high-density requirement due to its limited error correction capability associated with the hard-decision decoding (HDD). Furthermore, in the example of STT-MRAM, all the state of the art ECCs for STT-MRAM are non-adaptive with fixed encoders and decoders. The state of the art ECCs are thus generally designed for the worst-case scenarios, which lead to a waste of memory storage density and higher power consumption.

A need therefore exists to provide an error correction method and module for a NVM that seeks to overcome, or at least ameliorate, one or more of the deficiencies of the conventional ECCs mentioned above. It is against this background that the present invention has been developed.

SUMMARY

According to a first aspect of the present invention, there is provided an error correction method for a NVM, the method comprising: receiving a codeword read from the non-volatile memory; computing a reliability information for each bit of the codeword received; and performing a soft-decision decoding (SDD) technique to decode the received codeword, wherein the SDD technique comprises: forming a set of test patterns based on the reliability information; and determining whether to perform a HDD of a test pattern in the set of test patterns based on a distance between the test pattern and a candidate pattern.

Preferably, the SDD technique further comprises identifying a predetermined number of least reliable bits in the received codeword, and wherein said forming a set of test patterns comprises forming a set of test patterns with respect to the identified predetermined number of least reliable bits.

Preferably, said distance is a Hamming distance and said determining whether to perform a HDD of a test pattern comprises determining whether the Hamming distance between the test pattern and the candidate pattern is greater than a value, the value being the maximum number of bit errors correctable for the codeword.

Preferably, the method further comprises performing the HDD of the test pattern only when the Hamming distance between the test pattern and the candidate pattern is determined to be greater than said value.

Preferably, said determining whether to perform a HDD of a test pattern is performed for each test pattern in the set of test patterns, and wherein for each test pattern when a set of candidate patterns exists having one or more candidate patterns:
  compute one or more Hamming distances respectively between the test pattern and each candidate pattern in the set of candidate patterns; and
  perform the HDD of the test pattern only when the one or more Hamming distances computed for the test pattern are all greater than said value.

Preferably, the reliability information for each bit indicates a likelihood that the bit received is accurate, and the reliability information is based on a log-likelihood ratio (LLR) approximated by:

$$LLR \approx y_k - y_{k\_Threshold},$$

where $y_k$ is an analog signal of the codeword read from the non-volatile memory and $y_{k\_Threshold}$ is a predetermined threshold value of $y_k$.

Preferably, the codeword is a BCH code or a Hamming code.

In another embodiment, the codeword is an extended BCH code or an extended Hamming code, and the method further comprises:
  performing a HDD of the received codeword, and
  determining whether to perform the SDD technique to decode the received codeword based on whether the HDD of the received codeword is successful.

Preferably, the method further comprises adaptively adjusting a parameter that controls the predetermined number of least reliable bits in the received codeword to be identified based on one or more factors affecting the raw bit error rate of the non-volatile memory.

According to a second aspect of the present invention, there is provided an error correction module for a non-volatile memory, the error correction module comprises:
a reliability detector configured to receive a codeword read from the non-volatile memory and compute a reliability information for each bit of the codeword received; and
a soft-decision decoder configured to decode the received codeword,
wherein the soft-decision decoder is configured to:
form a set of test patterns based on the reliability information; and
determine whether to perform a HDD of a test pattern in the set of test patterns based on a distance between the test pattern and a candidate pattern.

Preferably, the soft-decision decoder is further configured to identify a predetermined number of least reliable bits in the received codeword, and wherein the set of test patterns is formed with respect to the identified predetermined number of least reliable bits.

Preferably, said distance is a Hamming distance and the soft-decision decoder configured to determine whether to perform a HDD of a test pattern comprises determining whether the Hamming distance between the test pattern and the candidate pattern is greater than a value, the value being the maximum number of bit errors correctable for the codeword.

Preferably, the soft-decision decoder is further configured to perform the HDD of the test pattern only when the Hamming distance between the test pattern and the candidate pattern is determined to be greater than said value.

Preferably, the soft-decision decoder is configured to determine whether to perform a HDD of a test pattern for each test pattern in the set of test patterns, and wherein for each test pattern when a set of candidate patterns exists having one or more candidate patterns, the soft-decision decoder is configured to:
compute one or more Hamming distances respectively between the test pattern and each candidate pattern in the set of candidate patterns; and
perform the HDD of the test pattern only when the one or more Hamming distances computed for the test pattern are all greater than said value.

Preferably, the reliability information for each bit indicates a likelihood that the bit received is accurate, and the reliability information is based on a log-likelihood ratio (LLR) approximated by:

$$LLR \approx y_k - y_{k\_Threshold},$$

where $y_k$ is an analog signal of the codeword read from the non-volatile memory and $y_{k\_Threshold}$ is a predetermined threshold value of $y_k$.

Preferably, the codeword is a BCH code or a Hamming code.

In another embodiment, the codeword is an extended BCH or an extended Hamming code, and the soft-decision decoder is further configured to perform a HDD of the received codeword, and determine whether to perform the SDD technique to decode the received codeword based on whether the HDD of the received codeword is successful.

Preferably, the soft-decision decoder is further configured to adaptively adjust a parameter that controls the predetermined number of least reliable bits in the received codeword to be identified in the received codeword based on one or more factors affecting the raw bit error rate of the non-volatile memory.

Preferably, the factors comprise a build-in self test result of the non-volatile memory, a temperature of the non-volatile memory, and a program cycle of the non-volatile memory.

According to a third aspect of the present invention, there is provided a memory system with error correction, the memory system comprising:
an encoder for encoding an input data into one or more codewords having error correction bits;
a non-volatile memory for storing the one or more codewords; and
an error correction module for decoding the codeword read from the non-volatile memory, the error correction module comprising:
a reliability detector configured to receive a codeword read from the non-volatile memory and compute a reliability information for each bit of the codeword received through the channel; and
a soft-decision decoder configured to decode the received codeword,
wherein the soft-decision decoder is configured to:
form a set of test patterns based on the reliability information; and
determine whether to perform a HDD of a test pattern in the set of test patterns based on a distance between the test pattern and a candidate pattern.

BRIEF DESCRIPTION OF THE DRAWINGS

Embodiments of the present invention will be better understood and readily apparent to one of ordinary skill in the art from the following written description, by way of example only, and in conjunction with the drawings, in which.

DETAILED DESCRIPTION

Figure 1:
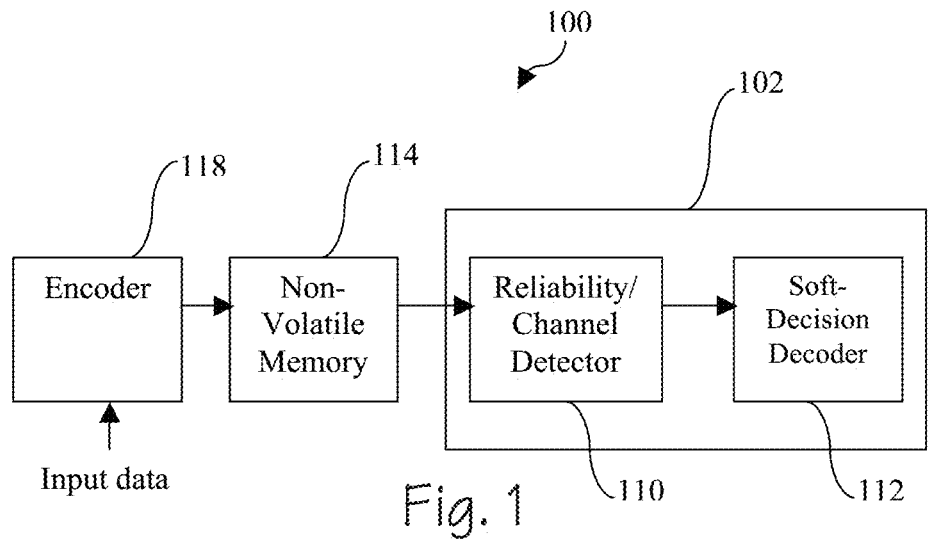
FIG. 1 depicts a schematic diagram of a memory system having an error correction module for a non-volatile memory (NVM) according to an embodiment of the present invention.

Embodiments of the present invention provide an error correction method and module for non-volatile memories (NVMs) that seek to overcome, or at least ameliorate, one or more of the deficiencies of the conventional ECCs mentioned in the background. For example, in an example embodiment, there is disclosed an error correction method that decodes BCH or Hamming codes using a SDD technique which reduces the number of HDD operations required. The SDD technique may thus be referred to as a reduced-complexity SDD technique. This advantageously achieves efficient memory error correction under the constraints of high code rate and low decoding complexity. In further embodiments, the SDD technique may further comprise a simplified Euclidean distance calculation and a simplified syndrome calculation which reduce the decoding complexity substantially. The SDD technique will be described in detail later below.

Embodiments of the present invention also provide a reduced-complexity SDD technique that is adaptively adjustable based on various factors affecting the raw bit error rate (BER) of the NVM, such as different NVM chips, working temperatures and program or SET/RESET cycles, without introducing additional code rate loss. Exemplary simulation results with the NVM (e.g., STT-MRAM) channels show that under the constraints of high code rate and low decoding complexity, BCH codes decoded by the reduced-complexity SDD technique according to embodiments of the present invention achieves a much better performance than both BCH codes decoded by conventional HDD only and low-density parity-check (LDPC) codes decoded by conventional SDD for example.

Embodiments of the present invention thus provide an error correction method and module which advantageously enables improvements to the storage density, power consumption, and average read latency of high-density and high-speed NVMs. Embodiments of the present invention will now be described in further details. It will be appreciated that the embodiments described herein can be modified in various aspects without deviating from the essence of the present invention.

Some portions of the description which follows are explicitly or implicitly presented in terms of algorithms and functional or symbolic representations of operations on data within a computer memory. These algorithmic descriptions and functional or symbolic representations are the means used by those skilled in the data processing arts to convey most effectively the substance of their work to others skilled in the art. An algorithm is here, and generally, conceived to be a self-consistent sequence of steps leading to a desired result. The steps are those requiring physical manipulations of physical quantities, such as electrical, magnetic or optical signals capable of being stored, transferred, combined, compared, and otherwise manipulated.

Unless specifically stated otherwise, and as apparent from the following, it will be appreciated that throughout the present specification, discussions utilizing terms such as "scanning", "calculating", "determining", "replacing", "generating", "initializing", "outputting", or the like, refer to the action and processes of a computer system, or similar electronic device, that manipulates and transforms data represented as physical quantities within the computer system into other data similarly represented as physical quantities within the computer system or other information storage, transmission or display devices.

The present specification also discloses apparatus for performing the operations of the methods. Such apparatus may be specially constructed for the required purposes, or may comprise a general purpose computer or other device selectively activated or reconfigured by a computer program stored in the computer. The algorithms and displays presented herein are not inherently related to any particular computer or other apparatus. Various general purpose machines may be used with programs in accordance with the teachings herein. Alternatively, the construction of more specialized apparatus to perform the required method steps may be appropriate.

In addition, the present specification also implicitly discloses a computer program or software/functional module, in that it would be apparent to the person skilled in the art that the individual steps of the methods described herein may be put into effect by computer code. The computer program is not intended to be limited to any particular programming language and implementation thereof. It will be appreciated that a variety of programming languages and coding thereof may be used to implement the teachings of the disclosure contained herein. Moreover, the computer program is not intended to be limited to any particular control flow. There are many other variants of the computer program, which can use different control flows without departing from the spirit or scope of the invention.

Furthermore, one or more of the steps of the computer program may be performed in parallel rather than sequentially. Such a computer program may be stored on any computer readable medium. The computer readable medium may include storage devices such as magnetic or optical disks, memory chips, or other storage devices suitable for interfacing with a general purpose computer. The computer program when loaded and executed on such a general-purpose computer effectively results in an apparatus that implements the steps of the methods described herein.

The software or functional modules described herein may also be implemented as hardware modules. More particularly, in the hardware sense, a module is a functional hardware unit designed for use with other components or modules. For example, a module may be implemented using discrete electronic components, or it can form a portion of an entire electronic circuit such as an Application Specific Integrated Circuit (ASIC). Numerous other possibilities exist. Those skilled in the art will appreciate that the system can also be implemented as a combination of hardware and software modules.

FIG. 1 depicts a schematic diagram of a memory system 100 having an error correction module 102 for a non-volatile memory (NVM) 114 according to an embodiment of the present invention. Preferably, the non-volatile memory is STT-MRAM but can also be PCM, RRAM, and/or NOR Flash for example. The error correction module 102 comprises a channel or reliability detector 110 configured to receive a codeword read from the non-volatile memory 114 and compute a reliability information or data for each bit of the codeword received, and a soft-decision decoder (i.e., reduced-complexity soft-decision decoder) 112 configured to decode the received codeword. Preferably, the codeword is a BCH or Hamming code, or an extended BCH or Hamming code. In particular, the soft-decision decoder 112 is configured to form a set of test patterns based on the reliability information, and determine whether to perform a HDD of a test pattern in the set of test patterns based on a distance between the test pattern and a candidate pattern.

Accordingly, since the soft-decision decoder 112 is operable to determine whether to perform a HDD of a test pattern in the set of test patterns, instead of simply performing a HDD on all test patterns in the set of test patterns as in conventional Chase decoders, the number of HDD operations can be significantly reduced. Moreover, in further embodiments of the present invention, the reduced-complexity SDD technique further comprises a simplified Euclidean distance calculation and a simplified syndrome calculation which have much lower computational complexity than those in conventional Chase decoders. This advantageously decreases decoding complexity which makes the error correction module 102 suitable for high-density and high-speed NVMs.

It will be appreciated to a person skilled in the art that the error correction module 102 may be specially constructed for the required purposes, or may be implemented in a general purpose computer or other devices. For example, the error correction module 102 may be a software module realized by a computer program or a set of instructions executable by a computer processor to perform the required functions, or may be a hardware module being a functional hardware unit designed to perform the required functions. It will also be appreciated that a combination of hardware and software modules may be implemented.

In an example embodiment, the soft-decision decoder 112 is further configured to identify a predetermined number (Q) of least reliable bits in the received codeword. In this regard, the above-mentioned set of test patterns is formed with respect to the identified predetermined number (Q) of least reliable bits. By way of an example, the predetermined number (Q) may be 4 and a set of $2^Q$ test patterns (i.e., 16) will be formed to include all possible binary combinations over these Q bit positions.

Further, in the example embodiment, the above-mentioned distance is a Hamming distance and the soft-decision decoder 112 configured to determine whether to perform a HDD of a test pattern comprises determining whether the Hamming distance between the test pattern and the candidate pattern is greater than a value (t), the value (t) being the maximum number of bit errors correctable for the codeword. In particular, the soft-decision decoder 112 is configured to perform the HDD of the test pattern only when the Hamming distance between the test pattern and the candidate pattern is determined to be greater than the value (t). More particularly, the soft-decision decoder 112 is configured to determine whether to perform a HDD of a test pattern for each test pattern in the set of test patterns. For each test pattern (when a set of candidate pattern exists having one or more candidate patterns), the soft-decision decoder 112 is configured to compute one or more Hamming distances respectively between the test pattern and each candidate pattern in a set of one or more candidate patterns (i.e., one Hamming distance is computed between the test pattern and each candidate pattern), and perform the HDD of the test pattern only when the one or more Hamming distances computed for the test pattern are all greater than the value (t). By performing the HDD on the test pattern only if the above condition is satisfied, the number of HDD operations required to decode a codeword by the soft-decision decoder 112 has been found to be advantageously reduced, without compromising error rate performances. As will be demonstrated later by way of examples below, this reduction is significant resulting in a major improvement in the decoding efficiency of the soft-decision decoder 112. In further embodiments, the soft-decision decoder 112 is further configured to perform a simplified Euclidean distance calculation and a simplified syndrome calculation which reduce the decoding complexity substantially.

As shown in FIG. 1, the memory system comprises an encoder 118 for encoding an input data into one or more codewords having error correction bits, a non-volatile memory 114 for storing the one or more codewords, and an error correction module 102 as described hereinbefore.

Figure 2A:
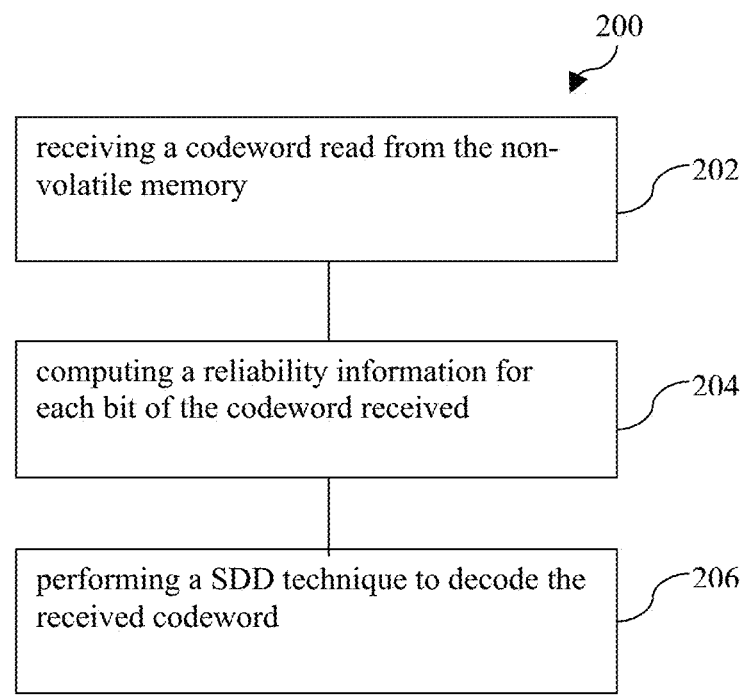
FIG. 2A depicts an overview of an error correction method for a non-volatile memory device according to an embodiment of the present invention.
Figure 2B:
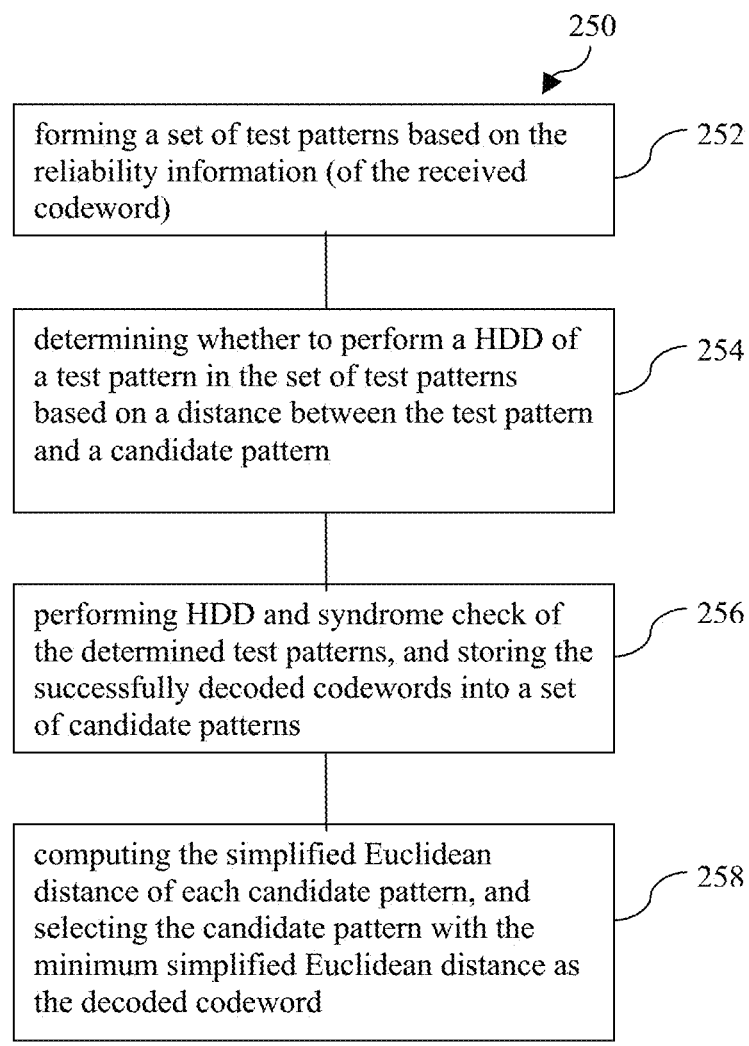
FIG. 2B depicts an overview of a SDD technique according to embodiments of the present invention.

FIG. 2A depicts an overview of an error correction method 200 for a non-volatile memory device 114 corresponding the error correction module 102 described above with respect to FIG. 1. The error correction method 200 comprising a step 202 of receiving a codeword read from the non-volatile memory 114, a step 204 of computing a reliability information or data for each bit of the codeword received, and a step 206 of performing a SDD technique (i.e., reduced-complexity SDD technique) 250 (see FIG. 2B) to decode the received codeword. Preferably, the codeword is a BCH or Hamming code, or an extended BCH or Hamming code. FIG. 2B depicts an overview of the SDD technique 250. The SDD technique 250 comprises a step 252 of forming a set of test patterns based on the reliability data, and a step 254 of determining whether to perform a HDD of a test pattern in the set of test patterns based on a distance between the test pattern and a candidate pattern. In further embodiments, the SDD technique 250 further comprises a step 256 of performing HDD and syndrome check of the determined test patterns and storing the successfully decoded codewords into a set of candidate patterns, and a step 258 of computing a simplified Euclidean distance of each candidate pattern, and selecting the candidate pattern with the minimum simplified Euclidean distance as the decoded codeword.

In line with the reduced-complexity soft-decision decoder 112 described above, in an example embodiment, the modified Chase technique 250 is further configured to identify a predetermined number (Q) of least reliable bits in the received codeword. In this regard, the above-mentioned set of test patterns is formed with respect to the identified predetermined number (Q) of least reliable bits. Also in the example embodiment, the above-mentioned distance is a Hamming distance and the above-mentioned step 254 of determining whether to perform a HDD of a test pattern comprises determining whether the Hamming distance between the test pattern and the candidate pattern is greater than a value (t), the value being the maximum number of bit errors correctable for the codeword. In particular, the SDD technique 250 is configured to perform the HDD of the test pattern only when the Hamming distance between the test pattern and the candidate pattern is determined to be greater than the value (t). More particularly, the SDD technique 250 is configured to determine whether to perform a HDD of a test pattern for each test pattern in the set of test patterns. For each test pattern, the SDD technique 250 is configured to compute one or more Hamming distances respectively between the test pattern and each candidate pattern in a set of one or more candidate patterns, and perform the HDD of the test pattern only when the one or more Hamming distances computed for the test pattern are all greater than the value (t).

It will be appreciated to a person skilled in the art that the methods or techniques of various embodiments described herein may be implemented as an executable computer program or a set of instructions executable by a computer processor to carry out the steps described therein. As another example, the methods or techniques may be implemented as one or more hardware modules being a functional hardware unit designed to perform the steps described therein. It will also be appreciated that a combination of hardware and software modules may be implemented.

For a better understanding of the present invention, the memory system 100 incorporating the error correction method 200 and module 102 as described above with reference to FIGS. 1 and 2 will now be described in further details, including specific components and configurations according to various embodiments of the present invention. Although the specific components and configurations described hereinafter may be preferred in certain embodiments of the present invention, it will be appreciated to a person skilled in the art that the present invention is not limited as such, and other components and configurations may be used as appropriate without deviating from the scope of the present invention.

As described in the background, for high-density and high-speed NVM such as those to be used as the DRAM replacement in the main memory in computer systems, the error-correcting coding (ECC) need to be designed to be able to handle high-density and high-speed NVM (preferably with ECC latency<10 ns), thus imposing contradictory or opposing requirements of high code rate and low decoding complexity. The state of the art ECCs used for NVM, in particular STT-MRAM, is the simple single-error-correcting Hamming code or BCH codes. Although the Hamming codes and BCH codes have fast encoders and decoders, they may not be sufficient to satisfy the high-density requirement due to their limited error correction capability associated with the HDD. On the other hand, under strict constraints of a short codeword length (preferably k≤256) and a high code rate (preferably about 0.9 or better), LDPC codes cannot be designed to have a large minimum hamming distance ($d_{min}$) (as known in the art, the minimum hamming distance is the minimum number of different bits or symbols between two codewords, which is an indication of the error correction capability of an ECC), or without having cycles of length 4. That is, the LDPC codes will have numerous cycles of length 4, or, if there is no cycles of length 4, then $d_{min}$ will be small. Therefore, the performance of LDPC codes will not be satisfactory even with soft-decision decoding (SDD). Furthermore, LDPC decoding is complex since it involves decoding iterations.

On the other hand, Hamming or BCH codes can be designed to have a large $d_{min}$ under the strict constraints of a short codeword length and a high code rate. However, their error correction capability with the conventional HDD is limited, and their performance can be improved by applying SDD to replace the HDD. An optimum SDD algorithm for BCH codes is the Bahl-Cocke-Jelinek-Raviv (BCJR) algorithm. However, this algorithm leads to a high-complexity decoder because the maximum number of states in the time-varying trellis of an (n,k) block code is $2^{(n-k)}$. To address this problem, according to example embodiments of the present invention, the BCH codes/Hamming codes are decoded using a SDD technique 250 which reduces the required number of HDD operations, thereby achieving efficient memory error correction under the constraints of high code rate and low decoding complexity.

Figure 3:
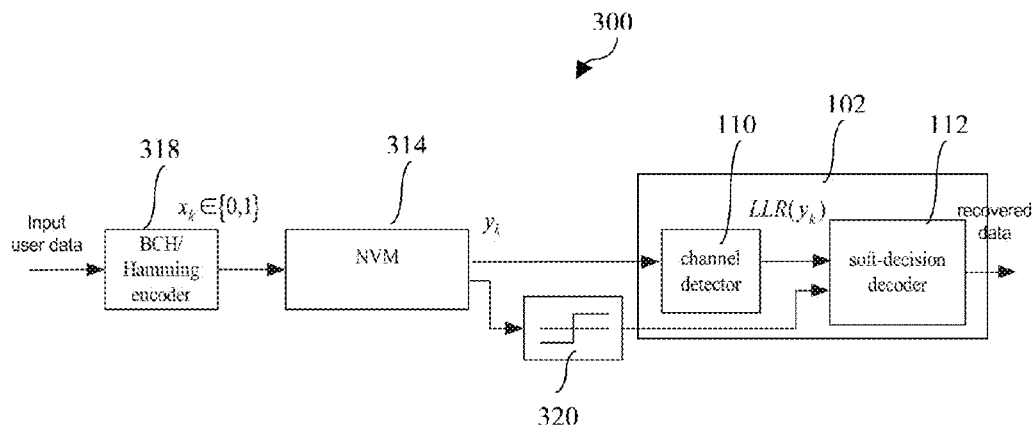
FIG. 3 depicts a schematic block diagram of an exemplary memory system according to an example embodiment of the present invention.

FIG. 3 depicts a schematic block diagram of an exemplary memory system 300 according to an example embodiment of the present invention which uses the soft-decision decoder 112 to decode BCH or Hamming codes. The memory system 300 comprises a BCH or Hamming encoder 318 for encoding an input data into BCH or Hamming codewords having error correction bits, a NVM 314 (e.g., STT-MRAM, PCM, RRAM, and/or NOR Flash) for storing the codewords, and an error correction module 102. The error correction module 102 comprises a channel or reliability detector (or soft-output detector) 110 configured to receive a codeword read from the NVM 314 and compute a soft-decision data (reliability information or data) for each bit of the codeword received, and a soft-decision decoder 112 as described hereinbefore. The memory system 300 further comprises a threshold detector (or slicer) 320 configured to receive a codeword read from the NVM 314 and perform HDD of the codeword.

Figure 4:
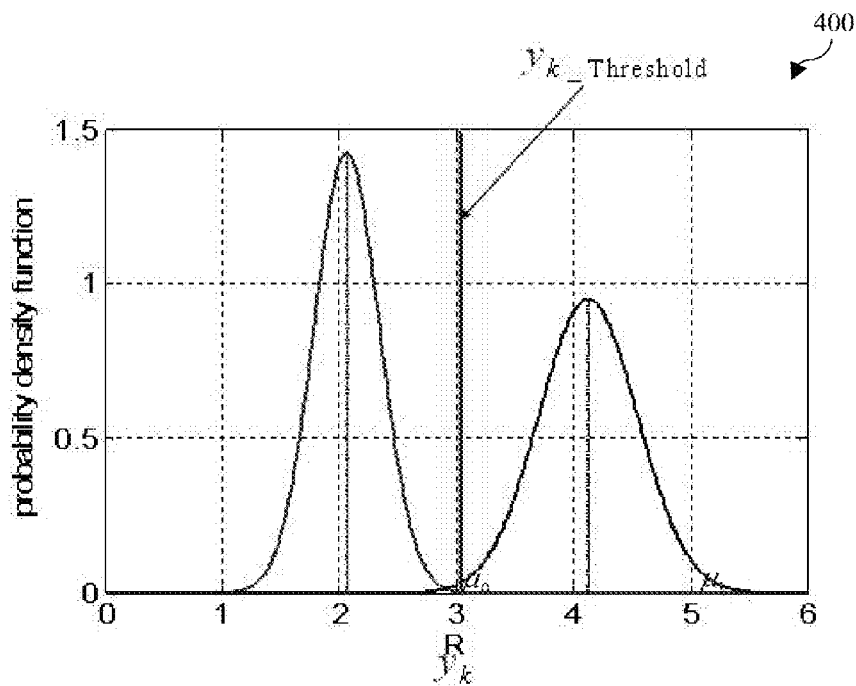
FIG. 4 depicts a plot showing the distributions and mean values of the low and high resistance states of the STT-MRAM in an example.

It should be noted that the application of a Chase decoder for NVM channels 316 is not straightforward since the soft-decision information (i.e., the log-likelihood ratios (LLRs)) of the NVM channels need to be first generated and sent to the input of the Chase decoder. Furthermore, generating such soft-decision information can be computationally intensive. In a preferred embodiment, to address this problem, the soft-output detector 310 is configured to generate the soft-decision data expressed in LLR which is approximated by:

$$LLR(y_k) \approx y_k - y_{k\_Threshold}, \qquad (1)$$

where $y_k$ is an analog signal of the codeword read from the non-volatile memory (i.e., analog memory readback signal) and $y_{k\_Threshold}$ is a predetermined threshold value of $y_k$. In particular, the predetermined threshold value $y_{k\_Threshold}$ is defined by the memory sensing circuitry. In practice, the value of $y_{k\_Threshold}$ is usually taken as $$y_{k\_Threshold} = \frac{\mu_0 + \mu_1}{2},$$

where $\mu_0$ and $\mu_1$, as shown in FIG. 4, are the mean values of the low and high resistance states of STT-MRAM, respectively.

Figure 5:
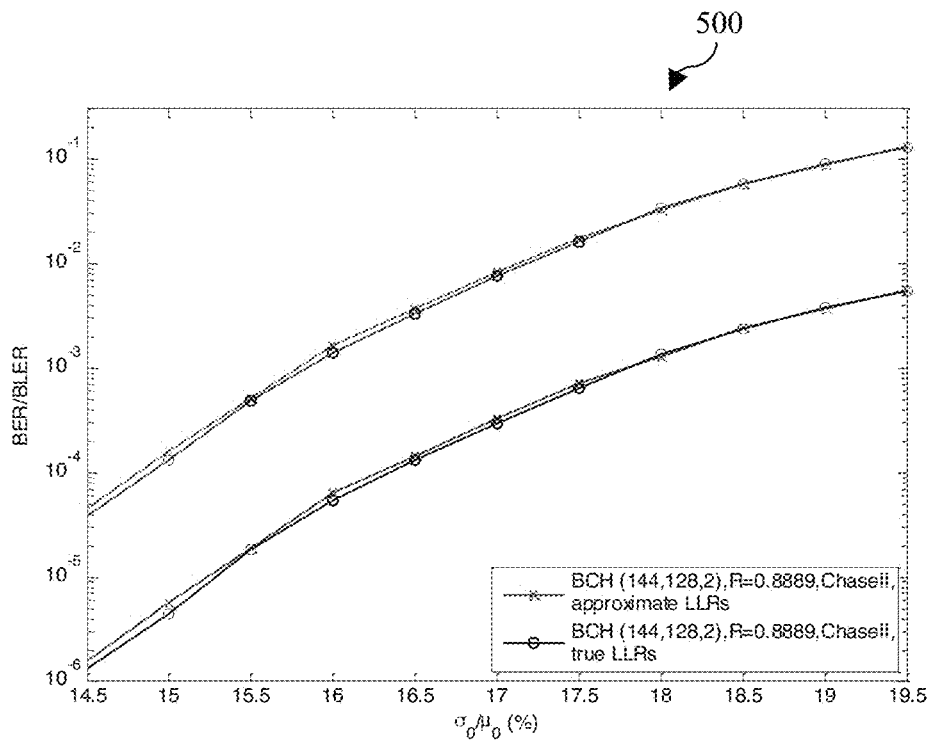
FIG. 5 depicts a plot showing the performance comparison between the LLRs approximated according to an embodiment of the present invention against the actual/true LLRs.

In order to evaluate the accuracy of the above LLR approximation of the NVM channels, exemplary computer simulations were carried out to decode BCH codes over STT-MRAM channel using the SDD technique 250 with the LLRs approximated by Equation (1) and with the actual/true LLRs (by assuming Gaussian distributed resistance distributions). FIG. 5 shows a plot 500 illustrating the performance comparison between the LLRs approximated by Equation (1) and the actual/true LLRs whereby the solid lines correspond to the bit error rate (BER) and the dashed lines correspond to the ECC block error rate (BLER). It can be observed from the performance comparison that both the BER and BLER obtained with the approximated LLRs closely match those obtained with the true LLRs. Therefore, this demonstrates that the above LLR approximation of the NVM channels by Equation (1) is sufficiently accurate, thereby making it possible to avoid the complexity associated with obtaining the true LLRs.

The soft-decision decoder 112 will now be described in further details according to an example embodiment. Chase decoding is a soft-input/hard-output for linear block code with low computational complexity. For example, for short BCH/Hamming codes, it has been found according to embodiments of the present invention that Chase decoding with properly tuned parameters is able to perform much better than the conventional HDD. Furthermore, Chase decoding can be implemented efficiently in a parallel manner and has no iterations.

First, for a better understanding, a conventional Chase decoding algorithm (Chase-II) is described. The conven tional Chase-II decoding algorithm is implemented using the following steps:
(1) Identify the least reliable Q bit positions based on the channel output;
(2) Form $2^Q$ test patterns by forming all possible binary combinations over these Q bit positions;
(3) Perform HDD of these test patterns and syndrome checks of the decoded codewords; and
(4) Make final hard-decisions by selecting the most likely valid decoded codeword based on the Euclidean distance calculation.

The logic operation complexity of the conventional Chase-II decoder is provided in the Table 1 below.

TABLE 1

Logic operations of the conventional Chase-II (P = 2Q: number of HDD operations per codeword, F = number of binary bits used to represent a floating-point number, n: BCH codeword length; m: degree of Galois field of BCH codes)

| Decoder | Logic Operations for HDD operation | Floating-Point Additions | Floating-point Multiplications | Floating-point Comparisons | Total Number of Logic Operations |
|---|---|---|---|---|---|
| Chase II Decoder for BCH codes | P(5mnt + 4m) (Lower bound) | P(2n − 1) | nP | p − 1 + nlog$_2$n | P(5mnt + 4m) + 4F(10nP − 1 + nlog$_2$n) (Lower bound) |
| | p(10mnt + 4m$^2$nt + 4m) (Upper bound) | | | | p(10mnt + 4m$^2$nt + 4m) + 4F(10nP − 1 + nlog$_2$n) (Upper bound) |

Through analyzing the complexity of the conventional Chase-II decoder in Table 1, it was found that the logic operations for HDD operations dominate the complexity of Chase-II decoding. Furthermore, it was found that during Chase-II decoding, it is very possible that two or more HDD operations produce the same decoded codeword. To address this problem, according to embodiments of the present invention, the SDD technique 250 is provided as described hereinbefore. Compared with the conventional Chase II decoding algorithm, the SDD technique 250 makes a modification to reduce the required number of HDD operations according to an embodiment, and makes further modifications to simplify the Euclidean distance calculation and the syndrome calculation during HDD according to further embodiments of the present invention.

For illustration purposes, the SDD technique 250 (including the modifications mentioned above) is implemented in an example embodiment using the following steps:
(1) Identify the least reliable Q bit positions based on the channel output;
(2) Form $2^Q$ test patterns by forming all possible binary combinations over these Q bit positions;
(3) Take a new test pattern from the set of test patterns obtained from Step (2). Check whether a stored set of candidate patterns is empty. If yes, go to Step (4). Otherwise, compute Hamming distances between the current test pattern and each of the stored set of candidate patterns (Hamming distance is the number of different bits (or symbols) between two codewords (or data patterns));
(4) If all the Hamming distances computed between the current test pattern and the candidate patterns are greater than t, where t is the number of bit errors that can be corrected by the BCH code, go to Step (5), otherwise, go to Step (3);
(5) Perform HDD of the current test pattern and syndrome checks of the decoded codeword. If the HDD decoder is declared a success, store the successfully decoded codeword by HDD into the set of candidate patterns;
(6) For the set of candidate patterns obtained from Step (5), compute the simplified Euclidean distance of each candidate pattern by using Equation (3) (see below) and select the candidate pattern with the minimum simplified Euclidean distance as the decoded codeword.

In the example embodiment above, unlike in the conventional Chase-II decoding algorithm whereby the Euclidean distance is computed as:

$$\hat{c}_{ML} = \operatorname{argmin}\sum_{i=0}^{n-1} (y_i - c_i)^2, \quad (2)$$

the SDD decoder 112 according to the further embodiment applies a simplified Euclidean distance, given by $$\hat{c}_{ML} = \operatorname{argmin}\sum_{i=0}^{n-1} |y_i - c_i|. \quad (3)$$

By doing so, the nP floating point multiplification operations, which is the second dominant in the complexity of the conventional Chase-II decoder in Table 1, is completely eliminated. Computer simulations have shown that the performance degradation by using the simplified Euclidean distance given by Equation (3) above is negligible.

Furthermore, the syndrome calculation in the HDD of the set of test patterns is also simplified in the soft-decision decoder 112 according to the further embodiment. As computing the syndrome of each test pattern requires (n−1)m binary additions, the total number of binary additions to compute the syndromes of all the set of test patterns in the conventional way is (n−1)mP. However, as there are determinist relationships between the syndromes of the test patterns, in the soft-decision decoder 112 according to the further embodiment, the syndrome of the first test pattern $S_0$ is computed using (n−1)m binary additions. The syndrome calculation of the remaining (P−1) test patterns can be computed recursively, using expression $$S_{j+1} = S_j + h_k, \quad (4)$$

where $S_j$ is the syndrome of the jth test pattern, with j=0, 1, 2, P−2, and $h_k$ is the kth row of the transpose of the parity-check matrix of the BCH codes, and k is the bit position that test pattern j+1 differ from test pattern j. In this way, the total number of binary additions to determine all the P syndromes is reduced from (n−1)mP to (n+$2^Q$−2)m.

For a better understanding, a specific example will now be described assuming that a 3-bit error is accrued in a received codeword of a BCH (144, 128, 2) code. The erroneous positions are 10, 25, and 38, respectively, and the erroneous bit values are '0', '1', '0', respectively. According to the SDD technique 250, the least reliable Q bit positions is first identified based on the channel output. With Q=2 and with a specific resistances spread (i.e. noise level), the least reliable 2-bit positions are identified as 38 and 25. Then, $2^Q$=4 test patterns are formed by forming all possible binary combinations over these 2 bit positions. Therefore, a set of 4 test patterns is obtained, whose bits differ with each other only at positions 25 and 38. Since the initial set of candidate patterns is empty, HDD and syndrome check of the first test pattern is performed, whose bits at positions 38 and 25 are '00'. In this example, the hard-decision decoder 320 declares a decoding failure of the first test pattern, and hence the next test pattern is examined whose bits at positions 38 and 25 are '01', and the hard-decision decoder 320 also declares a decoding failure. For the next (third) test pattern whose bits at positions 38 and 25 are '10', the erroneous bits at positions 38 and 25 are flipped, and hence there are only one bit error left at position 10, which can be corrected by HDD. Therefore, the hard-decision decoder 320 declares a decoding success, and the decoded codeword is stored into the set of candidate patterns. For the fourth test pattern whose bits at positions 38 and 25 are '11', its Hamming distance is computed with the only stored candidate pattern obtained from the previous step, and it turns out to be 2, which is not larger than the error correction capability of the BCH code with t=2. Hence, there is no need to carry out HDD for this test pattern. At this stage, all the four test patterns have been examined. In this example, since only one candidate pattern is obtained, SDD technique 250 directly determines the candidate pattern as the decoded codeword, and hence successfully correct the 3-bit error. On the other hand, if more than one candidate patterns are obtained, according to the further embodiment, the simplified Euclidean distance for each candidate pattern will be computed, and the one candidate pattern with the minimum simplified Euclidean distance will be selected as the decoded codeword.

A summary of the computation complexity of the soft-decision decoder 112 and a comparison with the conventional HDD for BCH codes (with t<5) is given by Table 2 below.

TABLE 2

Computational complexity comparison between the reduced-complexity SDD decoder and a HDD decoder of BCH code (P: average number of HDD operations per codeword, P1: average number of candidate patterns per codeword, P2: average number of Hamming distance calculation per codeword, F: number of binary bits used to represent a floating-point number)

| Decoder | Logic Operations for HDD operation | Floating-Point Additions | Floating-point Comparisons | Logic Operations | Total Number of Logic Operations |
|---|---|---|---|---|---|
| Reduced-Comlexity SDD for BCH codes | 4m(n + $2^Q$ − 2) + 4mp (Lower bound) 4m(n + $2^Q$ − 2) + P($4m^2$nt + 5mnt + 4m) (Upper bound) | $P_1$(2n − 1) | $P_1$ − 1 + $nlog_2 n$ | $P_2$n | 4m(n + $2^Q$ − 2) + 4mP + 4F($2nP_1$ − 1 + $nlog_2 n$) + $P_2$n (Lower bound) 4m(n + $2^Q$ − 2) + P($4m^2$nt + 5mnt + 4m) + 4F[$2nP_1$ − 1 + $nlog_2 n$] + $P_2$n (Upper bound) |
| HDD for BCH codes (t < 5) | P(5mnt + 4m) (Lower bound) p(10mnt + $4m^2$nt + 4m) (Upper bound) | | | | |

In order to evaluate the effectiveness of the soft-decision decoder 112, computer simulations were carried out to decode BCH codes over the STT-MRAM channel 314 using the reduced-complexity soft-decision decoder 112, with the decoding parameter, Q, set to 4. In the simulations, a resistance distribution based generic channel model was used to describe the distributions of the low and high resistances of STT-MRAM and their broadening, which are caused by the parametric variation induced fluctuation of the resistances, the write errors due to the switching threshold current distribution, as well as the read errors caused by the read disturbance. The testing results are based on the disclosure of Chen et al., "Advances and future prospects of spin-transfer torque random access memory," *IEEE Trans. Magn.*, vol. 46, no. 6, pp. 1873-1878, 2010, the contents of it being hereby incorporated by reference in its entirety for all purposes. The distributions of the static resistances of a 14 Kb STT-MRAM testing chip integrated with a 90 nm CMOS are fitted with Gaussian distribution, and are shown in FIG. 4. It can be observed that the mean values of the low and high resistance states are $\mu_0$=2.0625 kΩ and $\mu_1$=4.1250 kΩ, respectively, and the standard derivations are $\sigma_0$=0.0825 kΩ and $\sigma_1$=0.1238 kΩ, respectively. Thus, $\sigma_1$=1.5$\sigma_0$ and $\sigma_1/\mu_1$=0.75$\sigma_0/\mu_0$ are obtained. Note that in general, the relationship between the relative spreads of the two resistance states (i.e., $\sigma_1/\mu_1$ versus $\sigma_0/\mu_0$) does not change significantly in the lithography process. Note also that FIG. 4 shows only distributions of the static-state resistances of STT-MRAM, and variations of resistances due to write errors and read disturbance errors have not been included. Therefore, in the simulations, the resistance distributions are widened by enlarging $\sigma_0/\mu_0$ (and hence $\sigma_1/\mu_1$) to account for the enlarged spread of resistances due to write errors and read disturbance errors, as well as more process imperfections in the memory fabrication practice. The simulation results are shown in Table 3 below.

TABLE 3

Average number of HDD operations per codeword using
the SDD technique 250 for the STT-MRAM channel, with Q = 4

| $\sigma_0/\mu_0$ | 14.5% | 15% | 15.5% | 16% | 16.5% | 17% | 17.5% | 18% | 18.5% |
|---|---|---|---|---|---|---|---|---|---|
| Average Number of HDD operations | 6.1393 | 6.2608 | 6.4556 | 6.7339 | 7.1047 | 7.6072 | 8.2253 | 8.9509 | 9.7300 |
| Reduction of HDD operations | 61.63% | 60.87% | 59.65% | 57.91% | 55.60% | 52.46% | 48.59% | 44.06% | 39.19% |

Table 3 shows the average number of HDD operations per codeword of the SDD technique 250 for the STT-MRAM channel with different resistance distributions ($\sigma_0/\mu_0$) and with Q=4. The number of HDD operations required by the conventional Chase-II decoder would be 16 HDD operations since Q is set to 4 (i.e., $2^4$=16). It can be observed from Table 3 that a significant reduction of the HDD operations was achieved by the soft-decision decoder 112 for the STT-MRAM channel in the example, ranging from about 40% to about 60% reduction. Furthermore, it was found that the error rate performances of the soft-decision decoder 112 and the conventional Chase decoder are not different, thus achieving significant reduction in computational/decoding complexity without affecting error rate performance.

Figure 6:
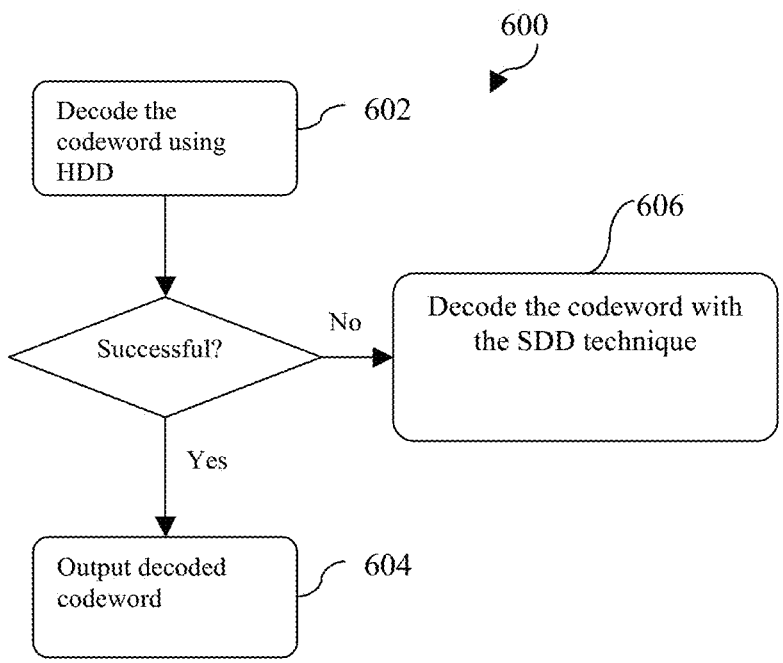
FIG. 6 depicts a flow diagram illustrating a further modified SDD technique according to a further embodiment of the present invention.

In an embodiment, the soft-decision decoder 112 is further modified (herein may be referred to as the second soft-decision decoder or 2-step hybrid decoder) to further reduce computational complexity by implementing a 2-step hybrid decoding technique (or second SDD technique) which combines the HDD and reduced-complexity SDD technique 250. The second SDD technique involves performing a hard-decision of the received codeword, and determining whether to perform the reduced-complexity SDD technique to decode the received codeword based on whether the HDD of the received codeword is successful. FIG. 6 depicts a flow diagram illustrating an exemplary second SDD technique 600 involving the following steps when decoding a codeword:

(1) perform HDD of the codeword, e.g., using the HDD decoder or slicer 320 shown in FIG. 3 (step 602);
(2) if the HDD of the codeword succeeds (e.g., as declared by the HDD decoder 320), output the decoded codeword and terminate the decoding process for the codeword (step 604); and
(2) if the HDD of the codeword fails (e.g., as declared by the HDD decoder 320), the decoding is proceeds with the reduced-complexity SDD technique 250 with reduced number of HDD operations.

Accordingly, with this two-step hybrid decoding technique 600, instead of carrying out the SDD algorithm on all codewords irrespective of the channel noise levels, HDD of the codeword is first performed, which has a much lower computational complexity than the soft-decision decoder 112. Then, only when the HDD fails, we continue the decoding with the more powerful SDD technique 250 as described hereinbefore. This advantageously avoids performing the SDD technique 250 in cases where HDD can be successful.

In an embodiment, it was found through analysis that the above two-step hybrid decoding technique 600 is more suitable to be used for the extended BCH/Hamming codes than the normal BCH/Hamming codes. A reason is that the extended BCH/Hamming codes are an extension of the normal codes by adding an overall parity-check digit. The extended BCH/Hamming codes are particular advantageous because the extension increases the minimum Hamming distance of the code by one. For example, for single-error-correcting Hamming codes with $d_{min}$=3, by adding one extra parity bit, the $d_{min}$ is increased to 4, and hence the codes are able to not only correct the single bit errors, but also detect the double bit errors. In the two-step hybrid decoding technique, the HDD (step 602) is carried out first. The HDD decoder 320 of the normal Hamming code can correct all the single bit errors. However, for the double bit errors, the HDD decoder 320 may make miscorrections. That is, although the HDD decoder 320 declares a successful decoding (and hence the second step 606 decoding is disabled), the double bit errors are actually miscorrected to other error patterns. This may significantly degrade the performance of the two-step hybrid decoding. On the other hand, with the extended BCH/Hamming codes, the double bit errors are detected and not corrected during the HDD. In this way, they can be successfully corrected by the more powerful soft-decision decoder 112 during the second step 606 of decoding. Therefore, the performance degradation associated with the first-step HDD is avoided.

Figure 7:
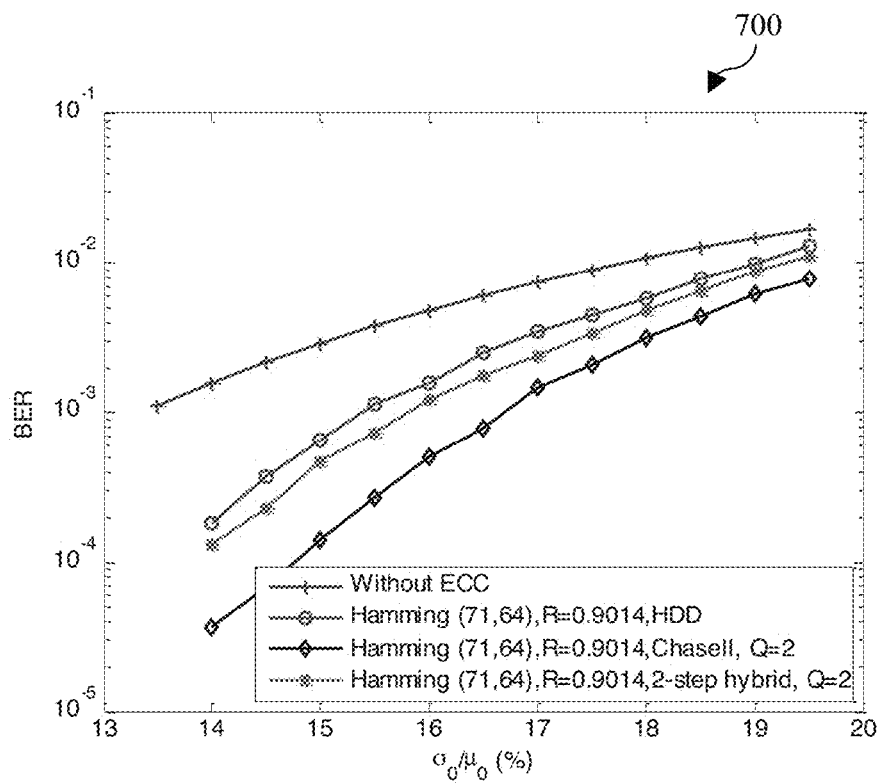
FIGS. 7 and 8 depict plots showing the bit error rate (BER) comparison between different decoders for a normal Hamming code and an extended Hamming codes, respectively.
Figure 8:
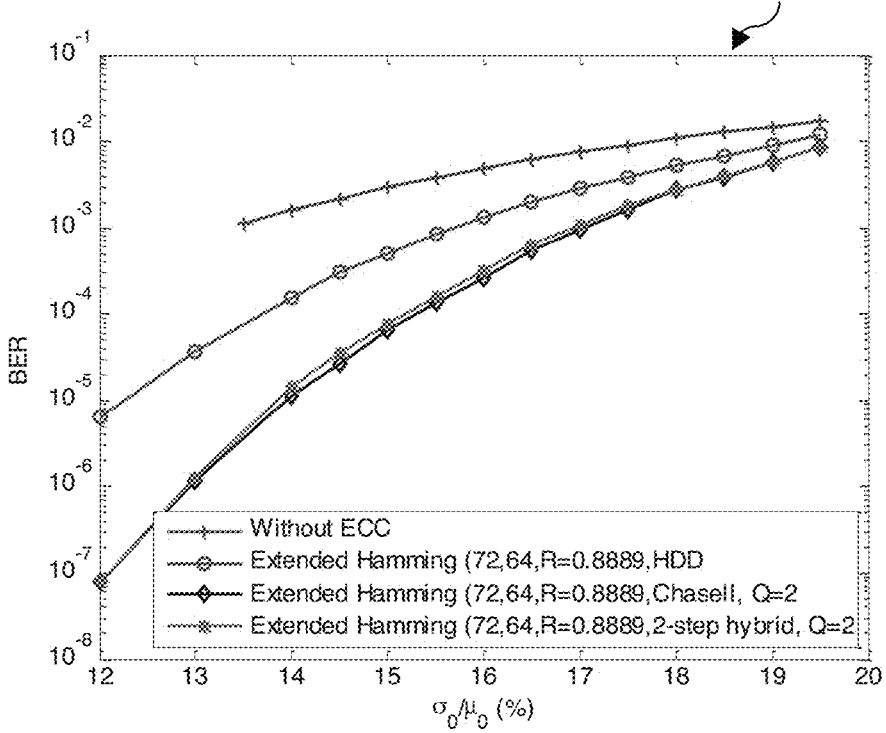

FIGS. 7 and 8 depict plots 700, 800 illustrating the bit error rate (BER) comparison with the HDD, the Chase decoder (with Q=2), and the two-step hybrid decoder, for the (71,64) normal Hamming code and the (72,64) extended Hamming codes, respectively. The BER performances for the case without ECC are also included as references. It can be observed that the soft-decision decoder 112 achieves significant performance gain for both the (71,64) Hamming codes and the (72,64) extended Hamming codes. However, FIG. 7 shows that for the (71,64) normal Hamming code, the two-step hybrid decoder provided only a little performance gain over the HDD, and has a significant performance degradation compared with the soft-decision decoder 112. On the other hand, FIG. 8 shows that for the case with the (72,64) extended Hamming codes, the two-stage hybrid decoder achieves a performance similar to the Chase decoding. Furthermore, simulation results show that at BER=$10^{-5}$, the average number of HDD operations has been significantly reduced from 2.0187 to 1.016. Thus, the computational complexity is halved with the two-step hybrid decoder. This demonstrates the further significant reduction in computational complexity with the two-step hybrid decoder compared with the soft-decision decoder 112 while achieving similar BER.

According to an embodiment of the present invention, the soft-decision decoder 112 may be further modified for adaptive decoding to accommodate for raw BER diversity of the NVM 114. In particular, the SDD technique 250 is further modified to adaptively adjust a parameter (Q) controlling the predetermined number of least reliable bits in the received codeword to be identified based on one or more factors affecting the raw bit error rate (BER) of the non-volatile memory 114. Advantageously, this is achieved without introducing additional code rate loss. In an example embodiment, the factors comprise a build-in self test result of the NVM (e.g., to account for different NVM resulting in different raw BER), the temperature of the NVM (e.g., to account for different working temperatures resulting in different raw BER), and a program or SET/RESET cycles of the NVM (e.g., to account for different program cycles resulting in different raw BER).

Figure 9:
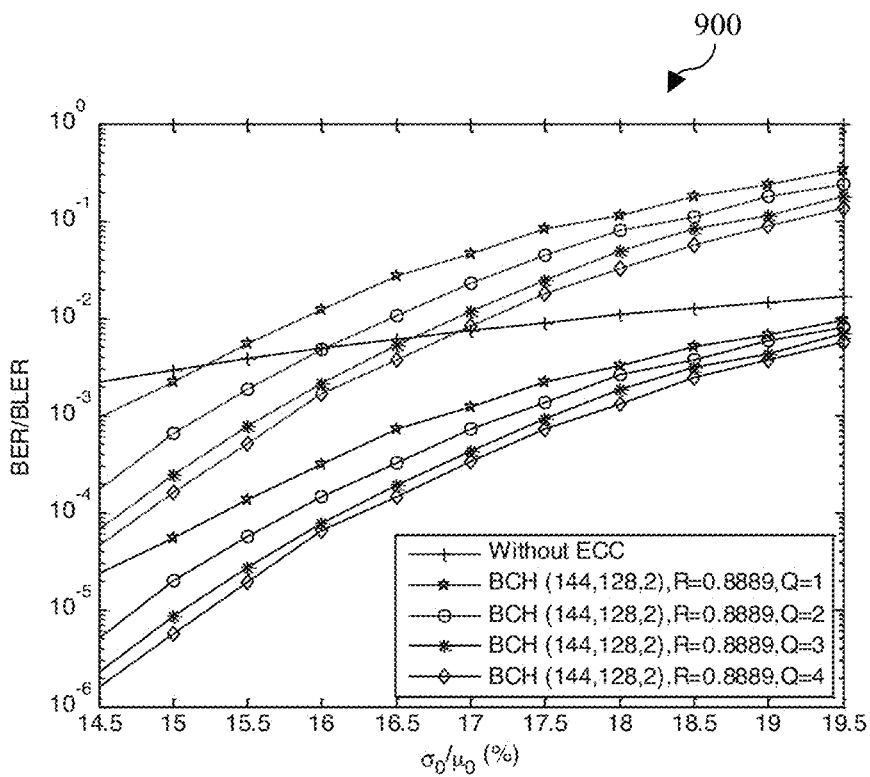
FIG. 9 depicts a plot showing the performance of a BCH code with Chase decoding for different decoder parameters Q.

In particular, through analyzing the properties of the SDD technique 250, it was found that by tuning the decoder parameter (Q) of the least number of reliable bit positions, there is a tradeoff between the decoding complexity and the error correction performance as illustrated in the plot 900 of FIG. 9. In an example embodiment, an exemplary adaptive decoding technique for NVM channels is implemented involving the following steps:
  (1) Tune the decoder parameter Q for different NVM chips by build-in self-test (BIST) during the memory post-fabrication stage;
  (2) Adjust the decoder parameter Q for different temperatures;
  (3) Adjust the decoder parameter Q for different program/SET-RESET cycles; and
  (4) During the tuning and parameter adjusting process, the decoder parameter Q is preferably increased only when the raw BER is not satisfactory.

Assume the target BER after ECC decoding is set to be $10^{-5}$ (This is for illustration purposes only, and in practice, the target BER after ECC is $10^{-12}$ or below). If the raw BER under a specific condition is measured to be $10^{-3}$, and according to FIG. 9, choosing a Q=2 can already bring down the BER to $10^{-5}$, and hence there is no need to choose a Q value of 3 or 4. If with the changes of NVM chips, working temperatures, or the program/SET-RESET cycles, the raw BER is decreased to $10^{-4}$, the value of Q can be tuned to 1 and the target BER after ECC can still be satisfied.

FIG. 9 depicts a plot 900 which illustrates the performance of the 0.8889 (144,128,2) BCH code with Chase decoding, with different decoder parameter Q. It can be observed that observed that by tuning/adjusting the value of Q, there is a tradeoff between the decoding complexity and the error correction performance. The above adaptive decoding technique enables saving in storage efficiency (thus improving storage density) and more tolerance to the process variations, and hence improves the yield and reduces the cost. Furthermore, it can reduce the power consumption and average read latency of NVM.

Figure 10:
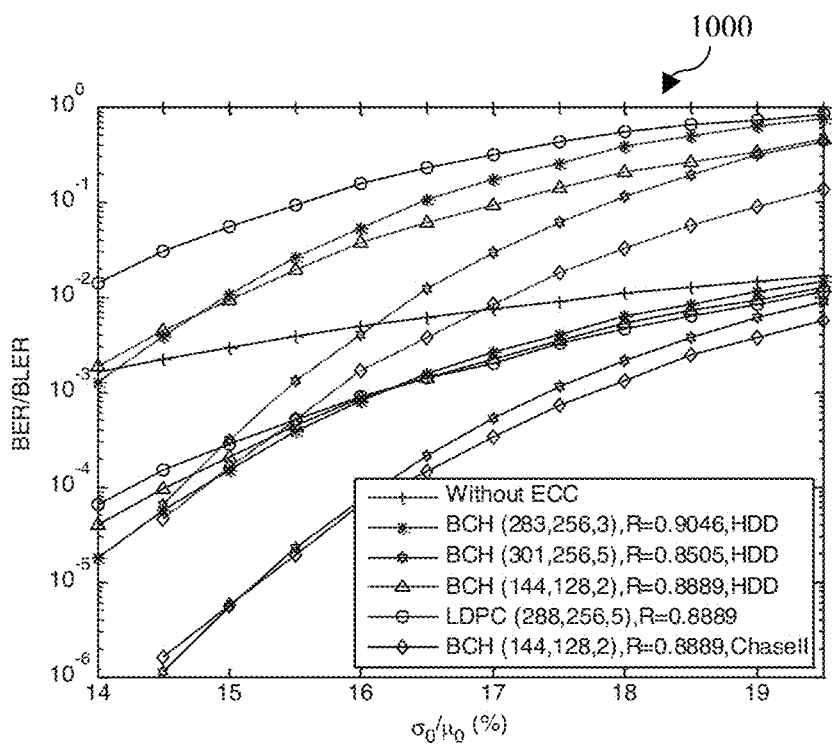
FIG. 10 depicts a plot showing the BER/BLER comparison between different ECC schemes.

Computer simulations have been carried out using the STT-MRAM channel as an example to demonstrate the effectiveness of the proposed efficient and adaptive error correction coding scheme. FIG. 10 depicts a plot 1000 which shows the BER/BLER comparison between different ECC schemes. For Chase decoding, the Q value is set to 4. As can be seen, the rate 0.8889 (144,128,2) BCH code with Chase decoding provides much better performance than that with HDD, and achieves a performance similar to the rate 0.8505 (301,256,5) BCH code. With a similar code rate, it provides a performance improvement of more than 1% in terms of the relative resistance spread over the (283,256,3) BCH code at BER=$10^{-5}$. An even larger performance gain is observed over the LDPC code with the same code rate (i.e., the rate 0.8889 (288,256) LDPC code).

The complexity comparison between the SDD technique 250 and the HDD of the BCH codes (with t=2) was shown in Table 2 above. Using the calculations presented in Table 2, Table 4 is provided below which compares the decoder complexity between the soft-decision decoder 112 of the (144,128,2) BCH code and the HDD of the (283,256,3) BCH code.

TABLE 4

Decoder complexity comparison between the (144,128,2) BCH code with the SDD technique 250 and the (283,256,3) BCH code with HDD

| Decoder Complexity | Total number of Binary Operations |
| --- | --- |
| Chase II: (144,128,2) BCH code | 3.535e+006 (Lower bound) 3.0847e+008 (Upper bound) |
| Reduced-Complexity SDD: (144,128,2) BCH code | 1.2342e+005 (Lower bound) 1.1716e+008 (Upper bound) |
| HDD : (283,256,3) BCH code | 1.0878e+006 (Lower bound) 2.2473e+008 (Upper Bound) |

In an experiment involving using Field Programmable Gate Arrays (FPGA), an FPGA analysis shows that the decoding latency of the (283,256,3) BCH code is close to the latency requirement of the DRAM. From Table 4, we observe that the reduced complexity Chase decoder of the (144,128,2) BCH code has lower decoding complexity than the HDD of the (283,256,3) BCH code, and hence has demonstrated the ability to meet up the high-speed requirements of the DRAM type applications.

Thus, according to embodiments of the present invention, there is provided an error correction method and module for non-volatile memories (NVMs) that decodes BCH or Hamming codes using a SDD technique 250 which reduces the number of HDD operations required, that is, a reduced-complexity SDD technique. This advantageously achieves efficient memory error correction under the constraints of high code rate and low decoding complexity for high-speed and high-density NVMs. Embodiments of the present invention also provide a SDD technique that is adaptively adjustable based on various factors affecting the raw bit error rate (BER) of the NVM, such as different NVM chips, working temperatures and program or SET/RESET cycles, without introducing additional code rate loss. Embodiments of the present invention thus advantageously enable improvements to the storage density, power consumption, and average read latency for high-density and high-speed NVMs.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An error correction method for a non-volatile memory, the method comprising:
  receiving a codeword read from the non-volatile memory;
  computing a reliability information for each bit of the codeword received; and
  performing a soft-decision decoding (SDD) technique to decode the received codeword,
  wherein the SDD technique comprises:

forming a set of test patterns based on the reliability information; and determining whether to perform a hard-decision decoding (HDD) of a test pattern in the set of test patterns based on a distance between the test pattern and a candidate pattern.

2. The method according to claim 1, wherein the SDD technique further comprises identifying a predetermined number of least reliable bits in the received codeword, and wherein said forming a set of test patterns comprises forming a set of test patterns with respect to the identified predetermined number of least reliable bits.

3. The method according to claim 1, wherein said distance is a Hamming distance and said determining whether to perform a HDD of a test pattern comprises determining whether the Hamming distance between the test pattern and the candidate pattern is greater than a value, the value being the maximum number of bit errors correctable for the codeword.

4. The method according to claim 3, further comprises performing the HDD of the test pattern only when the Hamming distance between the test pattern and the candidate pattern is determined to be greater than said value.

5. The method according to claim 4, wherein said determining whether to perform a HDD of a test pattern is performed for each test pattern in the set of test patterns, and wherein for each test pattern when a set of candidate patterns exists having one or more candidate patterns:

compute one or more Hamming distances respectively between the test pattern and each candidate pattern in the set of candidate patterns; and perform the HDD of the test pattern only when the one or more Hamming distances computed for the test pattern are all greater than said value.

6. The method according to claim 1, wherein the reliability information for each bit indicates a likelihood that the bit received is accurate, and the reliability information is based on a log-likelihood ratio (LLR) approximated by:

$$LLR \approx y_k - y_{k\_Threshold}.$$

where $y_k$ is an analog signal of the codeword read from the non-volatile memory and $y_{k\_Threshold}$ is a predetermined threshold value of $y_k$.

7. The method according to claim 1, wherein the codeword is a BCH code or a Hamming code.

8. The method according to claim 1, wherein the codeword is an extended BCH code or an extended Hamming code, and the method further comprises:

performing a HDD of the received codeword, and determining whether to perform the SDD technique to decode the received codeword based on whether the HDD of the received codeword is successful.

9. The method according to claim 2, further comprising adaptively adjusting a parameter that controls the predetermined number of least reliable bits in the received codeword to be identified based on one or more factors affecting the raw bit error rate of the non-volatile memory.

10. The method according to claim 9, wherein the factors comprise a build-in self test result of the non-volatile memory, a temperature of the non-volatile memory, and a program cycle of the non-volatile memory.

11. An error correction module for a non-volatile memory, the error correction module comprises:

a reliability detector configured to receive a codeword read from the non-volatile memory and compute a reliability information for each bit of the codeword received; and a soft-decision decoder configured to decode the received codeword, wherein the soft-decision decoder is configured to:

form a set of test patterns based on the reliability information; and determine whether to perform a hard-decision decoding (HDD) of a test pattern in the set of test patterns based on a distance between the test pattern and a candidate pattern.

12. The error correction module according to claim 11, wherein the soft-decision decoder is further configured to identify a predetermined number of least reliable bits in the received codeword, and wherein the set of test patterns is formed with respect to the identified predetermined number of least reliable bits.

13. The error correction module according to claim 11, wherein said distance is a Hamming distance and the soft-decision decoder configured to determine whether to perform a HDD of a test pattern comprises determining whether the Hamming distance between the test pattern and the candidate pattern is greater than a value, the value being the maximum number of bit errors correctable for the codeword.

14. The error correction module according to claim 13, wherein the soft-decision decoder is further configured to perform the HDD of the test pattern only when the Hamming distance between the test pattern and the candidate pattern is determined to be greater than said value.

15. The error correction module according to claim 14, wherein the soft-decision decoder is configured to determine whether to perform a HDD of a test pattern for each test pattern in the set of test patterns, and wherein for each test pattern when a set of candidate patterns exists having one or more candidate patterns, the soft-decision decoder is configured to:

compute one or more Hamming distances respectively between the test pattern and each candidate pattern in the set of candidate patterns; and perform the HDD of the test pattern only when the one or more Hamming distances computed for the test pattern are all greater than said value.

16. The error correction module according to claim 11, wherein the reliability information for each bit indicates a likelihood that the bit received is accurate, and the reliability information is based on a log-likelihood ratio (LLR) approximated by:

$$LLR \approx y_k - y_{k\_Threshold},$$

where $y_k$ is an analog signal of the codeword read from the non-volatile memory and $Y_{k\_Threshold}$ is a predetermined threshold value of $y_k$.

17. The error correction module according to claim 11, wherein the codeword is a BCH code or a Hamming code.

18. The error correction module according to claim 11, wherein the codeword is an extended BCH or an extended Hamming code, and the soft-decision decoder is further configured to perform a HDD of the received codeword, and determine whether to perform the SDD technique to decode the received codeword based on whether the HDD of the received codeword is successful.

19. The error correction module according to claim 12, wherein the soft-decision decoder is further configured to adaptively adjust a parameter that controls the predetermined number of least reliable bits in the received codeword to be identified in the received codeword based on one or more factors affecting the raw bit error rate of the non-volatile memory.

20. A memory system with error correction, the memory system comprising:
- an encoder for encoding an input data into one or more codewords having error correction bits;
- a non-volatile memory for storing the one or more codewords; and
- an error correction module for decoding the codeword read from the non-volatile memory, the error correction module comprising:
  - a reliability detector configured to receive a codeword read from the non-volatile memory and compute a reliability information for each bit of the codeword received; and
  - a soft-decision decoder configured to decode the received codeword,
  - wherein the soft-decision decoder is configured to:
  - form a set of test patterns based on the reliability information; and
  - determine whether to perform a HDD of a test pattern in the set of test patterns based on a distance between the test pattern and a candidate pattern.

\* \* \* \* \*